United States Patent [19]
Makino et al.

[11] Patent Number: 5,452,318
[45] Date of Patent: Sep. 19, 1995

[54] GAIN-COUPLED DFB LASER WITH INDEX COUPLING COMPENSATION

[75] Inventors: Toshi Makino, Nepean; Guo P. Li, Ottawa, both of Canada

[73] Assignee: Northern Telecom Limited, Montreal, Canada

[21] Appl. No.: 170,074

[22] Filed: Dec. 16, 1993

[51] Int. Cl.⁶ .................................................. H01S 3/08
[52] U.S. Cl. ........................................ 372/96; 372/45; 372/46
[58] Field of Search ............................. 372/96, 45, 46

[56] References Cited

U.S. PATENT DOCUMENTS

| | | | |
|---|---|---|---|
| 4,894,835 | 1/1990 | Uomi et al. | 372/45 |
| 5,164,956 | 11/1992 | Lang | 372/96 |
| 5,208,824 | 5/1993 | Tsang | 372/96 |
| 5,289,494 | 2/1994 | Tada et al. | 372/96 |

OTHER PUBLICATIONS

"Coupled-Wave Theory of Distributed Feedback Lasers", Kogelnik et al, J. Appl. Phys., vol. 43, No. 5, May 1972.
"Purely Gain-Coupled Distributed Feedback Semiconductor Lasers", Luo et al, Appl. Phys. Lett., vol. 56, No. 17, Apr. 23, 1990.
"1.55 um Gain-Coupled Quantum-Well Distributed Feedback Lasers . . . ", Borchert et al, IEEE Trans. Photons Tech. Letters, vol. 3, No. 11, Nov. 1991.
"Long-Wavelength InGaAsP/InP Distributed Feedback Lasers . . . ", Tsang et al, IEEE Photonis Technology Letters, vol. 4, No. 3, Mar. 1992.
"1.55 um Index/Gain Coupled DFB Lasers with Strained Layer . . . ", Li et al, Electronics Letters, 27th Aug. 1992, Vo. 28, No. 18, pp. 1726–1727.

*Primary Examiner*—Georgia Y. Epps
*Attorney, Agent, or Firm*—George MacGregor

[57] ABSTRACT

A gain-coupled distributed feedback (DFB) laser or amplifier structure having a gain-coupling grating in the form of grooves periodically etched through strained, multi-quantum wells. The etched grooves are regrown with buffer material having a bandgap selected to compensate for index-coupling aid to block carrier leakage. The low carrier leakage reduces non-radiative recombination which in turn increases quantum efficiency.

20 Claims, 4 Drawing Sheets

GAIN-COUPLED DFB LASER WITH INDEX COUPLING COMPENSATION

FIELD OF THE INVENTION

This invention relates to a gain-coupled distributed feedback (DFB) laser and more particularly to a gain-coupled DFB laser having periodic etched grooves through the quantum well active layer. The etched grooves are regrown with material which compensates for index coupling and blocks carrier leakage.

1. Background of the Invention

Long-reach high capacity fiber optic communication systems require light sources capable of generating single mode, narrow line width emission in the 1.3–1.56 μm wavelength range. InGaAsP DFB lasers can be tailored to emit light of the proper wavelength but the high single-mode yield requirement has been harder to achieve. Conventional index coupled DFB devices employing an index corrugation have an inherent problem in that there exists pairs of longitudinal modes having equal threshold gain which ultimately results in multi-mode operation. This mode degeneracy has been controlled to some extent by providing an asymmetric facet coating to each face of the laser. The facet coating, however, cannot ensure single mode operation because of the random facet phases introduced by cleaving.

2. Prior Art

It was suggested by Kogelnik et al in J. Applied Physics 43, 1972, pp. 2327–2335, that the threshold degeneracy could be avoided by having the light generated in the device coupled back by perturbations occurring in the gain coefficient. Luo et al (Appl. Phys. Lett., Vol. 56, pp. 1620–22, April 1990), demonstrated gain coupling through the use of periodic thickness variations in the active layer. Index coupling resulting from the periodic thickness variations was compensated or cancelled by an underlying grating with an opposite spatial phase. This structure proved to be complex and therefore difficult to put into practice.

Borchert et al (IEEE Transactions Photonics Technology Letters, Vol. 3, No. 11, November 1991, pp. 955–57, 1991) describe a gain or, more accurately, a loss grating structure. The loss grating, which is separated from the active layer, requires very careful control of grating formation and regrowth characteristics. Tsang et al (IEEE Photonics Technology Letters, Vol. 4, No. 3, March 1992, pp. 212–214), disclose a structure similar to that described by Borchert et al except that the loss grating, separated from the active layer, incorporates a multi guantum well structure. U.S. Pat. No. 5,208,824, which issued May 4, 1993 to Tsang, discloses the same or similar DFB semiconductor lasers. G.P. Liet al in Electronic Letters, Vol. 28, No. 18, 27 Aug. 1992, pp. 1726–27, describe an InP/InGaAsP index/gain coupled DFB laser having a strained-layer, multi-quantum-well active grating. The gracing is generated by etching grooves through the multiquantum well active region and regrowing InP buffer material in the etched grooves. Devices fabricated from this structure and having a 125 μm cavity length operated CW at 25° C. The threshold current was 19 mA and the maximum output power was 10 mw. The quantum efficiency was only 0.12 mw/mA.

SUMMARY OF THE INVENTION

It is an object of the present invention to provide a high performance DFB lasing device.

It is a further object of the present invention to provide a purely gain coupled DFB laser demonstrating efficient, single-mode operation.

Therefore in accordance with a first aspect of the present invention there is provided a gain-coupled, distributed feedback (DFB), semi-conducting lasing device comprising a substrate, an active region on the substrate including material having a first bandgap $E_{g1}$ and capable of generating light and gain in response to a current flowing therethrough. A gain coupling grating having periodic grooves etched through the active region is provided. The grooves are regrown with a first layer having a second bandgap $E_{g2}$ wherein $E_{g2} > E_{g1}$. A second regrown layer on top of the first layer has a third bandgap, $E_{g3}$ wherein: $E_{g2} > E_{g3} > E_{g1}$. A current confining ridge is on the active region and contacts are provided on the ridge and substrate.

In accordance with a second aspect of the invention there is provided a method of fabricating a gain-coupled DFB semi-conducting lasing device. The method includes the steps of:

(a) growing material capable of generating light and gain for optical amplification on a substrate, the material including a cladding layer, a first separate confinement layer, a plurality of quantum wells separated by quantum barriers, and a second separate confinement layer, the quantum wells having a first bandgap $E_{g1}$;

(b) etching periodic grooves through the quantum wells;

(c) regrowing a first layer of a first material in the grooves, the first material having a second bandgap $E_{g2}$ wherein $E_{g2} > E_{g1}$;

(d) regrowing a second layer of a second material on the first layer, the second layer having a third bandgap $E_{g3}$ wherein $E_{g2} > E_{g3} > E_{g1}$;

(e) regrowing on the second layer a buffer layer, an etch stop layer, a second cladding layer and a capping layer;

(f) forming a current confinement ridge in the capping and cladding layers; and (g) forming contacts on the ridge and substrate.

BRIEF DESCRIPTION OF THE DRAWINGS

The invention will now be described in greater detail having regard to the appended drawings in which.

DETAILED DESCRIPTION OF THE INVENTION

Figure 1:
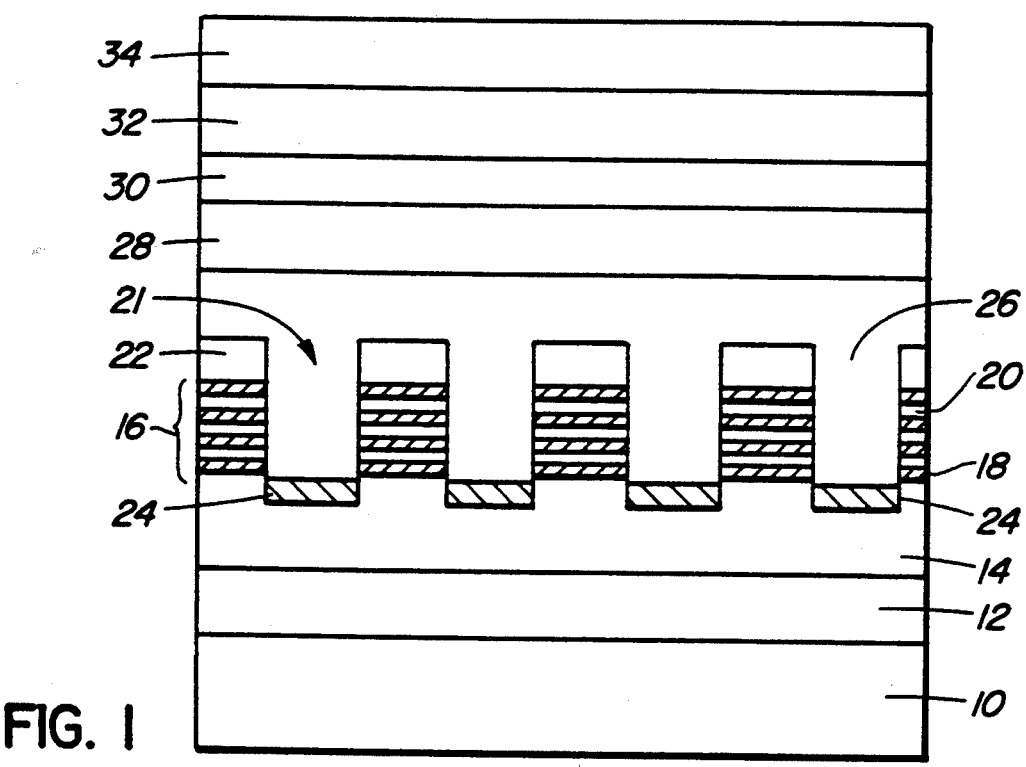
FIG. 1 is a cross-sectional view of the structure according to the invention.

As discussed in relation to the prior structure described by G.P. Li et al (Electronic Letters, Vol. 28, No. 18), the quantum efficiency of that index/gain coupled configuration was relatively low. It is believed that this is due, in part, to the fact that some of the carriers flow directly through the InP buffer material regrown in the etched channels and not through the active material. The structure as disclosed herein overcomes this source of non-radiative recombination. More specifically, and with reference to FIG. 1, the present device includes an n-type InP substrate 10 on which is grown a 1.5 μm thick buffer layer 12 of n-type InP and 900 Å separate confinement layer 14 of n-type InGaAsP (1.25 Q). Next a multi-quantum well (MQW) active region 16 is grown. The MQW in a preferred embodiment consists of four 55 Å-thick 1.5% compressively strained p-type InGaAsP quantum wells 18 separated by three 100 Å-thick unstrained barriers 20 of p-type InGaAsP (1.25 Q). The bandgap $E_{g1}$ of the quantum well material is around 0.83 eV (1.50 Q). On top of the MQW active region 16 a 200 Å thick p-type InGaAsP confinement layer 22 is grown.

The wafer is then removed from the growth chamber and processed so as to photolithographically generate the patterns necessary to etch the periodic grooves 21. First a dielectric such as $S_iO_2$ (not shown) is grown on the surface of the wafer and the groove pattern which is dependent on the type of lasing device that is being fabricated is created in the dielectric layer. For example, an edge emitting device will be provided with parallel, linear grooves defining a first order grating, the pitch of which is determined in accordance with the following formula:

$$\Lambda = \lambda/2n$$

where:

$\Lambda$ = pitch,
$\lambda$ = wavelength of emission,
n = modal index of refraction.

If the device is a surface emitting laser there will be both first and second order gratings which may be linear or circular, depending on the application. The grooves are etched using reactive ion etch (RIE) or a wet chemical etching process. The residual dielectric material is then removed.

Using known crystal growth techniques such as metal organic chemical vapour deposition (MOCVD), a first layer 24 of regrowth material is grown in the grooves 21. This layer, which in this embodiment is p-type InP, is approximately 100 Å thick. The material has a nominal bandgap $E_{g2}$ of 1.35 eV (0.92 InP) which is wider than the bandgap of the quantum well material 18. This first layer 24 serves two functions:

1. provides a buffer for subsequently regrown layers, and
2. serves as a block to current flowing through the grooves so as to concentrate current flow through the active region.

Without removing the wafer from the growth chamber a second regrowth layer 26 is grown on top of the buffer or first layer 24. The second layer 26, which is approximately 700 Å-thick, is preferably p-type InGaAsP having a nominal bandgap $E_{g3}$ of 1 eV (1.25 Q), i.e., not as wide as the first layer but wider than the bandgap of the quantum wells. This second layer 26 also serves as a second separate confinement layer. A 600 Å p-type InP buffer 28 is grown next, followed by a 50 Å p-type InGaAsP etch stop layer 30, a 1.5 μm p-type InP cladding 32 and a 0.2 μm highly p-doped capping layer 34 of InGaAs for contact enhancement.

Figure 2:
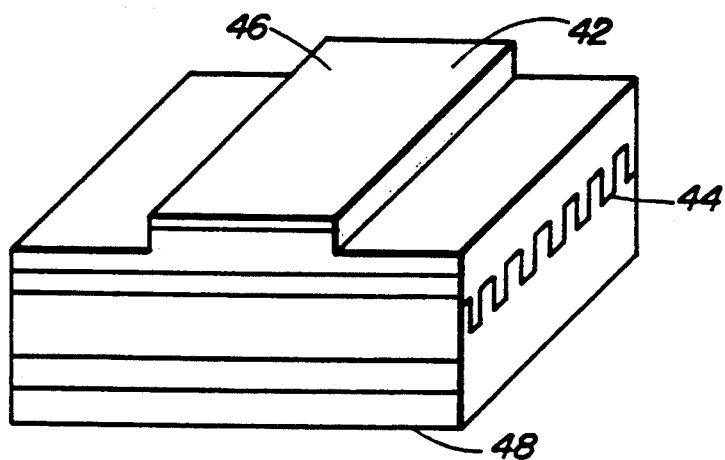
FIG. 2 is a perspective view of an edge-emitting laser.
Figure 3:
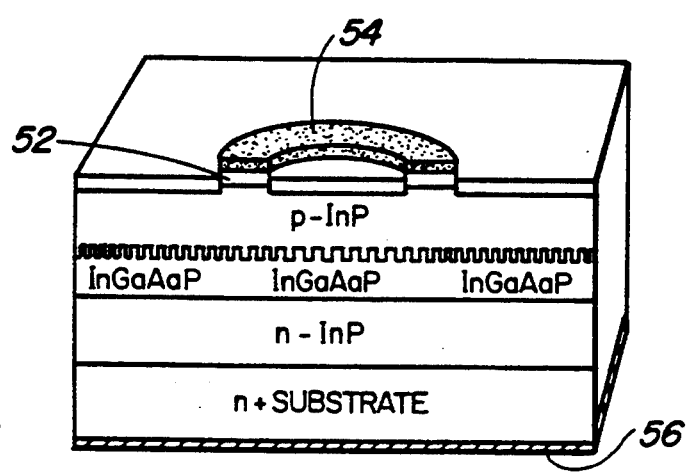
FIG. 3 is a cross-sectional view of a surface emitting laser.

For an edge-emitting laser as shown in FIG. 2, a rectangular shaped ridge 42 perpendicular to the grooves 44 is formed by etching through the capping and top cladding layer. For a surface-emitting structure as shown in FIG. 3, an annular ridge 52 such as described in co-pending U.S. application Ser. No. 08/158,543 filed on Nov. 29, 1993, entitled "Circular Grating Lasers" (Wu et al) is etched in the capping and cladding layers. The above application is incorporated herein by reference.

Contacts 46,54 are formed on the p-type ridge 42,52 respectively and n-type contacts 46,54 are provided on substrate 48,56 respectively to complete the structure.

In the structure as described with reference to FIG. 1, the wide bandgap buffer layer 24 in the grooves serves to channel injection current laterally through the quantum wells, which otherwise would flow directly through the first separate confinement layer. This reduces non-radiative recombination resulting in higher quantum efficiency. The lateral carrier injection into the quantum wells improves operational speed of the device.

Further, the medium bandgap material in the grooves (second layer) serves as an index-coupling compensation so that the device operates as a purely gain-coupled structure which, in turn, results in single mode output.

This description applies as well to devices operated below threshold in a DFB optical amplifier mode.

Because the gain-coupling grating is etched through the active region and not separated from the active region as taught in the prior art, the device is highly manufacturable with a relatively high level of tolerance to processing variables.

For the sake of clarity, the device structure has been defined in terms of an n-type substrate and p-type regrowth. It is to be understood, however, that the material selection may be reversed such that a p-type substrate is used with the concomitant n-type regrowth.

Figure 4:
FIG. 4 is a scanning electron micrograph of the device of FIG. 1.

FIG. 4 is a scanning electron micrograph showing the periodic grooves etched through the quantum wells and regrown layers of the structure of FIG. 1.

Figure 5:
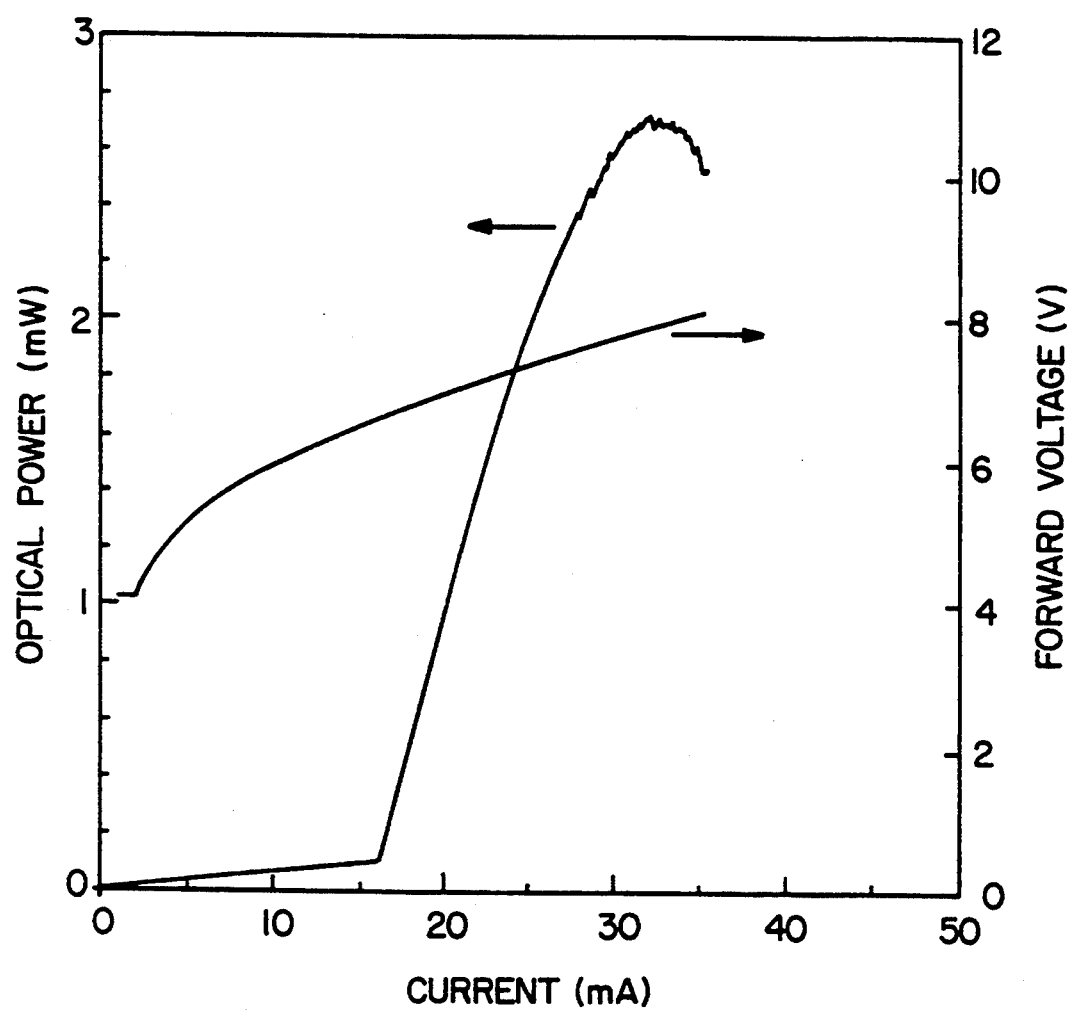
FIG. 5 illustrates L-I and V-I characteristics of a device according to the invention.

FIG. 5 illustrates both V-I and L-I characteristics of a device manufactured in accordance with the preferred embodiment of the invention. A threshold current of 17 mA is observed.

Figure 6A:
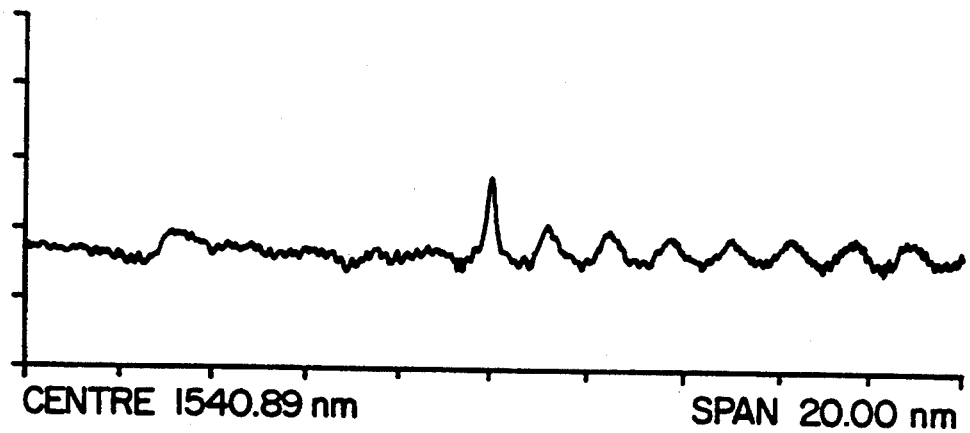
FIGS. 6a and 6b are oscillation spectrums of a device fabricated in accordance with the invention, below and above threshold respectively.
Figure 6B:
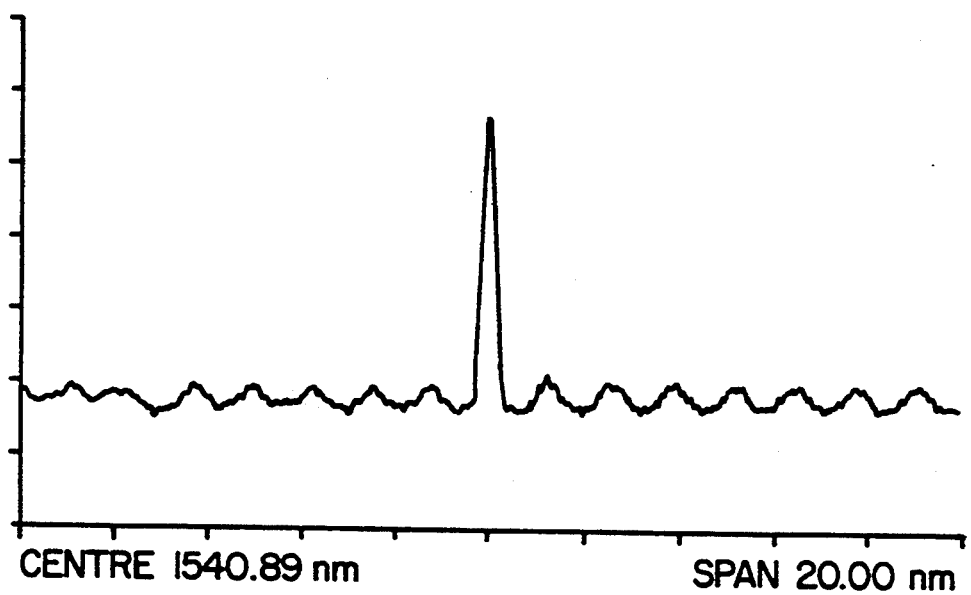

FIG. 6a is a wavelength plot showing the oscillation spectrum below threshold. FIG. 6b illustrates the spectrum above threshold with oscillation centering at 1540.89 nm. The laser can operate exactly at Bragg wavelength without DFB stopband.

For laser or amplifier structures oscillating in the 0.8 to 0.9 μm wavelength range, devices fabricated in the same architecture but utilizing a GaAs/AlGaAs alloy combination can be prepared.

While certain specific embodiments of the invention have been described, it will be apparent to one skilled in the art that other alternatives or variations are possible. It is to be understood, however, that such alternatives or variations will fall within the scope of the invention as defined in the appended claims.

We claim:

1. A gain-coupled, distributed feedback (DFB), semiconducting, lasing device comprising:
   a) a substrate;
   b) an active region on said substrate, said active region comprising material having a bandgap $E_{g1}$, said material capable of generating light and gain in response to a current therethrough;

c) a gain coupling grating having periodic etched channels through said active region;

d) a first regrown layer in said etched channels, said first regrown layer having a second bandgap $E_{g2}$, wherein $E_{g2} > E_{g1}$;

e) a second regrown layer on said first regrown layer said second regrown layer having a third bandgap $E_{g3}$; wherein $E_{g2} > E_{g3} > E_{g1}$;

f) a current confining ridge on said active region and;

g) contacts on said confining ridge and said substrate for use in injecting current into said active region.

2. A lasing device as defined in claim 1, said active region capable of generating light and gain for lasing action when the current therethrough exceeds threshold.

3. A lasing device as defined in claim 1, operating as an oscillating amplifier where the current therethrough is below threshold.

4. A lasing device as defined in claim 2, said active region including a plurality of quantum wells separated by quantum barriers.

5. A lasing device as defined in claim 2, said gain coupling grating being a first order grating.

6. A lasing device as defined in claim 5, wherein lasing action generates a laser beam which exits the edge of said device.

7. A lasing device as defined in claim 2, said active region being circular and surrounded by a second order grating which is surrounded by a first order grating.

8. A lasing device as defined in claim 6, the laser output being normal to the surface of said device.

9. A lasing device as defined in claim 1, the first and second regrown layers having the effect of diverting the current flow through said channels laterally through said quantum wells.

10. A lasing device as defined in claim 9, said second regrown layer having the effect of cancelling index coupling by said gain coupling grating.

11. A lasing device as defined in claim 2, said current confining ridge having a parallelpiped shape.

12. A lasing device as defined in claim 7, said current confining ridge being circular.

13. An amplifier as defined in claim 1, said substrate being N-type and said current confining ridge being P-type.

14. An amplifier as defined in claim 1, said substrate being P-type and said current confining ridge being N-type.

15. A lasing device as defined in claim 1, having the following bandgaps:

$E_{g1} = 0.83$ eV
$E_{g2} = 1.35$ eV
$E_{g3} = 1$ eV

16. A lasing device as defined in claim 1, said substrate being InP.

17. A lasing device as defined in claim 16, said generated light being in the wavelength range of 1.3–1.56 μm.

18. A lasing device as defined in claim 1, said substrate being GaAs.

19. A lasing device as defined in claim 18, said generated light being in the wavelength range of 0.8–0.9 μm.

20. A method of fabricating a gain-coupled, distributed feedback (DFB) semi-conductor lasing device, said method comprising:

a) epitaxially growing material capable of generating light and gain for optical amplification on a substrate, said material including a first cladding layer, a separate confinement layer, a plurality of quantum wells separated by quantum barriers and, a second separate confinement layer, said quantum wells having a first bandgap $E_{g1}$;

b) etching periodic grooves through said quantum wells;

c) regrowing a first layer of a first material in said grooves, said first material having a second bandgap $E_{g2}$, wherein $E_{g2} > E_{g1}$;

d) regrowing a second layer of a second material on said first layer, said second layer having a third bandgap $E_{g3}$, wherein $E_{g2} > E_{g3} > E_{g1}$;

e) regrowing on said second layer a buffer layer, an etch stop layer, a second cladding layer and a capping layer, f) forming a current confining ridge in said capping layer and said cladding layer and;

g) forming contacts on said ridge and said substrate.

* * * * *